US007139190B1

(12) United States Patent
de Jong

(10) Patent No.: US 7,139,190 B1
(45) Date of Patent: Nov. 21, 2006

(54) SINGLE EVENT UPSET TOLERANT MEMORY CELL LAYOUT

(75) Inventor: Jan L. de Jong, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 38 days.

(21) Appl. No.: 11/152,503

(22) Filed: Jun. 14, 2005

(51) Int. Cl.
*G11C 11/00* (2006.01)
(52) U.S. Cl. .............. 365/154; 365/155; 365/156; 365/72
(58) Field of Classification Search .......... 365/154, 365/155, 156, 63, 72
See application file for complete search history.

(56) References Cited

U.S. PATENT DOCUMENTS

| 5,640,341 | A | * | 6/1997 | Bessot et al. .......... 365/156 |
| 5,981,995 | A | * | 11/1999 | Selcuk .......... 257/330 |
| 6,058,041 | A | * | 5/2000 | Golke et al. .......... 365/156 |
| 6,563,727 | B1 | * | 5/2003 | Roth et al. .......... 365/49 |
| 2006/0133134 | A1 | * | 6/2006 | Doyle et al. .......... 365/154 |

OTHER PUBLICATIONS

Velazco, R. et al., "Two CMOS Memory Cells Suitable for the Design of SEU-Tolerant VLSI Circuits,"IEEE, 1994, pp. 2229-2234, available from IEEE, 3 Park Avenue, 17th Floor, New York, NY 10016-5997.
Tosaka, Y. et al., "Comprehensive Study of Soft Errors in Advanced CMOS Circuits with 90/130 nm Technology," IEEE, 2004, pp. 38.3.1-38.3.4, available from IEEE, 3 Park Avenue, 17th Floor, New York, NY 10016-5997.
Kawakami, Yikiya et al., "Investigation of Soft Error Rate Including Multi-Bit Upsets in Advanced SRAM Using Neutron Irradiation Test and 3D Mixed-Mode Device Simulation," IEEE, 2004, pp. 38.4.1-38.4.4, available from IEEE, 3 Park Avenue, 17th Floor, New York, NY 10016-5997.

* cited by examiner

*Primary Examiner*—Richard Elms
*Assistant Examiner*—Toan Le
(74) *Attorney, Agent, or Firm*—Scott Hewett

(57) ABSTRACT

Half cells of single-event-upset-tolerant memory cells are offset by at least two rows in a memory array. Offsetting the half cells separates them to avoid simultaneous damage to both half cells from a high-energy particle that could otherwise alter multiple nodes and corrupt the data state of the memory cell. Separating the half cells by at least two rows avoids corruption that could occur if diagonally arranged half cells were hit by a high-energy particle. In a particular embodiment, offset half cells are used at the top and bottom, respectively, of two adjacent columns of memory half cells.

13 Claims, 5 Drawing Sheets

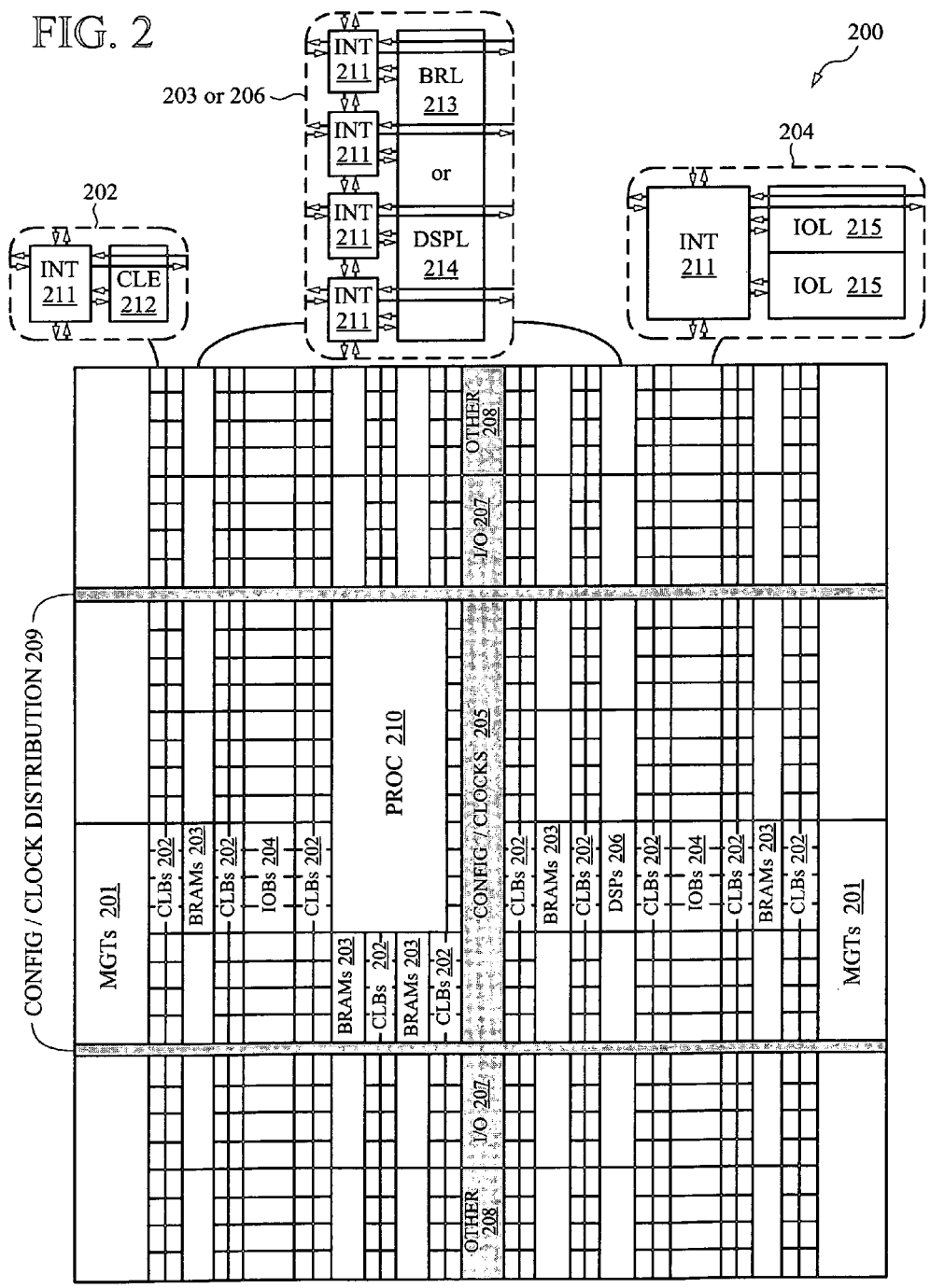

|  422  |  424  |  426  | 428  |
|---|---|---|---|
| S₁ | M1B | M11A | S₃ |
| S₂ | M2B | M12A | S₄ |
| M1A |  |  | M11B |
| M2A |  |  | M12B |
| . |  |  | . |
| . |  |  | . |
| . |  |  | . |
| . |  |  | . |
| . | M9B | M19A | . |
| . | M10B | M20A | . |
| M9A | S₅ | S₆ | M19B |
| M10A | S₇ | S₈ | M20B |

SINGLE EVENT UPSET TOLERANT MEMORY CELL LAYOUT

FIELD OF THE INVENTION

This invention relates generally to complementary metal-oxide-semiconductor ("CMOS") memory cells, and more particularly to memory cells tolerant to heavy ion damage.

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

PLDs and other ICs that are specialized to be radiation tolerant are desirable for certain applications. Such ICs are often referred to as single event upset (SEU) tolerant ICs, heavy ion tolerant (HIT) ICs or radiation-hardened ICs. An SEU arises when a heavy ion or high-energy particle, such as an alpha particle or neutron, hits a memory cell, charging internal nodes of the memory cell that can change the memory state. For convenience of discussion, an SEU will be referred to as an "ion hit," whether it involves an ion or other high-energy particle causing the error.

Two basic approaches to improve SEU tolerance have been tried. One approach is commonly called "resistive hardening;" however, resistive hardening can significantly degrade latch performance. Another disadvantage arises if a standard CMOS fabrication has to be modified to accommodate a resistively hardened IC. It is highly desirable that SEU tolerant ICs be made using standard CMOS fabrication processes.

Another approach to improve SEU tolerance is commonly called "design hardening." Design hardening generally refers to laying out a memory cell or other circuit to improve recovery of data after ion hits. A general discussion of design hardening is found in the paper entitled Two CMOS Memory Cells Suitable for the Design of SEU-Tolerant VLSI Circuits, by Bessot et al., IEEE Transactions on Nuclear Science, Vol. 41, No. 6 (December 1994).

In design hardening, basically redundant storage bits are located in two different places, maintaining a source of uncorrupted data after an SEU corrupts one of the storage bits. Many variations are known, using sixteen-, fourteen- and twelve-transistor HIT memory cells.

FIG. 1A is a circuit diagram of a prior-art twelve-transistor memory cell 100. Output nodes $Q_A$, $Q_B$ are initially at "1" and "0" states, respectively. In normal operation, a low (inactive) read/write signal RW conserves the logical states of the output nodes $Q_A$, $Q_B$. During a read operation, $V_{DD}$ data lines 102, 104 are precharged. Output $Q_A$ will remain high as the read/write signal RW goes high because output $Q_A$ is connected to the data line 102 through transistors 106, 108. Output $Q_B$ will remain low because transistors 110, 112 are both one, discharging data line 104.

Providing new data values on data lines 102, 104 (i.e. data values "0" and "1", respectively), while the read/write signal RW goes high changes the state of the memory cell 100. In this condition, transistor 114 will push node 116 high, turning transistor 118 OFF and transistor 106 ON. Since transistor 120 is OFF, output $Q_A$ is coupled to data line 102, forcing the value at output $Q_A$ to "0." Transistor 112 is turned OFF, coupling output $Q_B$ to data line 104. Output QB is forced to "1," which turns transistor 120 ON and turns transistor 114 OFF. Thus, output $Q_A$ asserts a "0" value, and node 118 presents a high impedance.

From the initial state of the memory cell 100 (i.e. $Q_A$=1, $Q_B$=0), output nodes $Q_A$, $Q_B$ and node 116 are sensitive to SEU. For example, if a high-energy particle, represented by arrow 107, strikes the drain of transistor 106, output node $Q_A$ will go low. Transistor 112 will turn OFF, and transistor 122 will turn ON. Then, output node $Q_B$ is not biased, but will conserve its "0" state by capacitive effect. Transistors 122 and 124 are both ON, but the gate width of transistor 122 is designed to be longer than the gate width of transistor 124; thus, node 126 will remain at 1. Transistor 118 is still ON, and output node $Q_A$ is restored to "1," recovering the upset.

If a high-energy particle, represented by arrow 127, strikes the drain of transistor 128, output node $Q_B$ will go to "1," turning transistor 120 ON and turning transistor 114 OFF. Node 116 goes to a high impedance, conserving its "0" state. Transistors 130, 112 are still ON, and output node $Q_B$ is restored to its initial state of "0."

If a high-energy particle, represented by arrow 131, hits the drain of transistor 132, node 116 will go high, turning transistor 106 ON and turning transistor 118 OFF. As transistor 120 and transistor 124 are OFF, output node 116 and node 126 become high-impedance nodes, which conserves their data states. Output node $Q_B$ is still low, and transistor 114 will remain ON, restoring the state of node 116.

However, the contents of the memory cell 100 can be corrupted by a high-energy particle strike that affects more than one node. For example, a particle strike at node 116 results in transistors 118, 124 turning OFF. If that same particle also strikes output node $Q_A$, transistor 112 turns OFF and transistor 122 turns ON. Node 126 is pulled down, turning transistor 128 ON, and turning transistor 130 OFF. Then, output node $Q_B$ goes high, turning transistor 120 ON and turning transistor 124 OFF. Node 116 is asserted to "1" and output node $Q_A$ is asserted to "0," thus the contents (i.e. memory state(s)) of the memory cell 100 are corrupted. In similar fashion, a particle strike on output nodes $Q_B$ and 116 can corrupt data in the memory cell 100.

FIG. 1B is a circuit diagram of another prior-art twelve-transistor memory cell 150. The operation of the memory cell 150 will be familiar to those of skill in the art, and a detailed description of its operation is therefore omitted. However, the memory cell 150 can also be corrupted by a particle strike that affects multiple nodes.

Therefore, memory that is more tolerant to an SEU strike affecting multiple nodes is desirable.

SUMMARY OF THE INVENTION

Half cells of SEU-tolerant memory cells are offset by at least two rows in a memory array. Offsetting the half cells separates them to avoid simultaneous damage to both half cells from a high-energy particle that could otherwise affect multiple nodes and corrupt the data state of the memory cell. Separating the half cells by at least two rows avoids corruption that could occur if diagonally arranged half cells were hit by a high-energy particle. In a particular embodiment, offset half cells are used at the top and bottom, respectively, of two adjacent columns of memory half cells.

BRIEF DESCRIPTION OF THE DRAWINGS

FIG. 2 is a plan view of an FPGA architecture suitable for implementing embodiments of the invention.

FIG. 4B is a diagram of a memory array according to another embodiment of the invention.

DETAILED DESCRIPTION OF THE DRAWINGS

An Exemplary FPGA

Figure 1A:
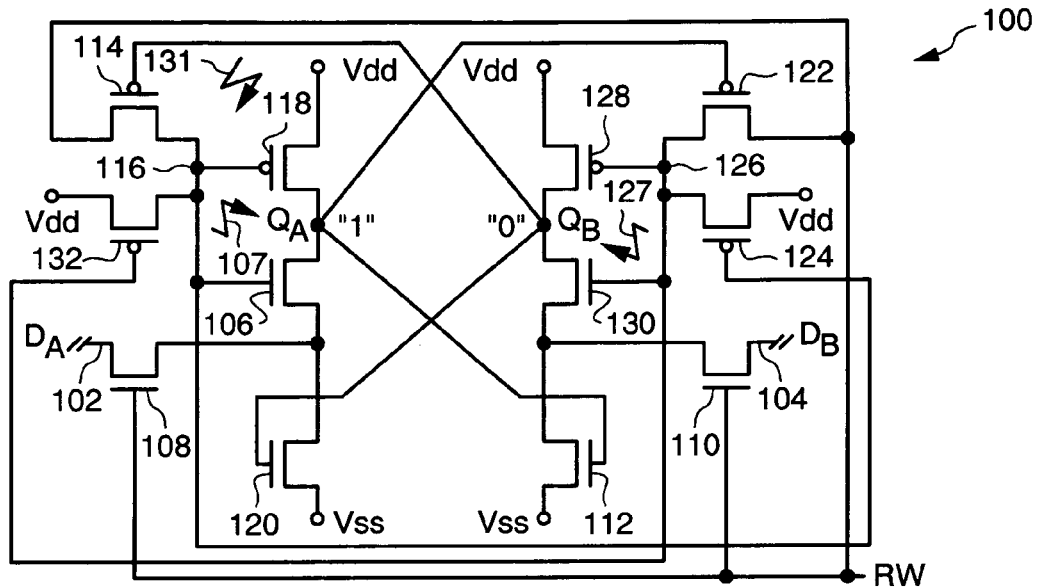
FIG. 1A is a circuit diagram of a prior-art twelve-transistor memory cell.
Figure 1B:
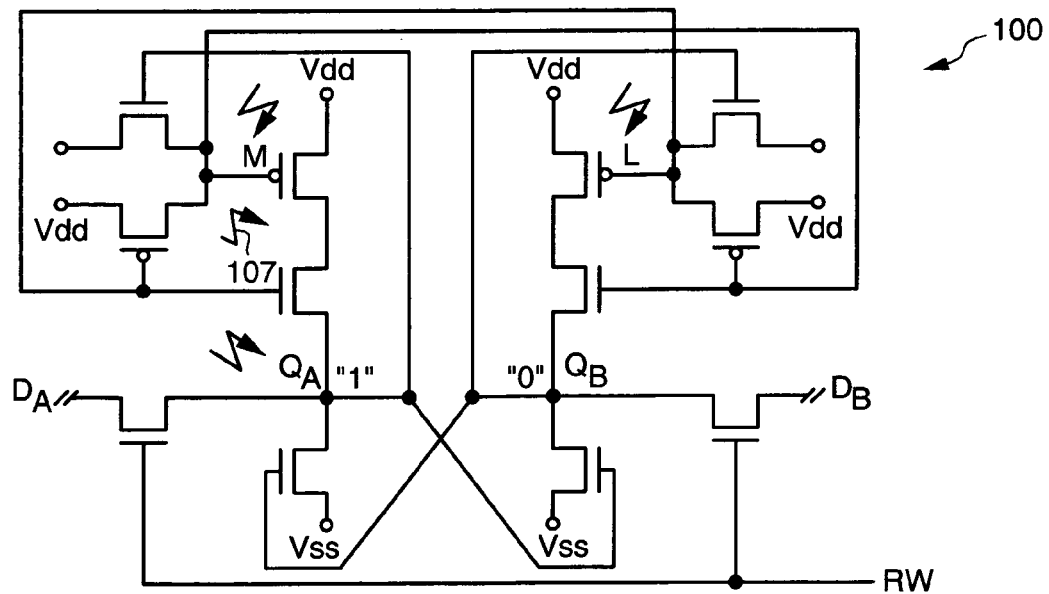
FIG. 1B is a circuit diagram of another prior-art twelve-transistor memory cell.

FIG. 2 illustrates an FPGA architecture 200 suitable for implementing embodiments of the invention. The FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Embodiments of the invention are incorporated in any of several portions of the FPGA 200. For example, SEU-tolerant memory cells and memory arrays are incorporated in BRAMs or configuration memory. Configuration memory is distributed throughout an FPGA and is generally present in numerous types of programmable blocks, such as CLBs and IOs. Some types of memory, such as block memory, use error code correction techniques, and are less susceptible to SEU errors. Configuration memory is particularly susceptible to SEU because error code correction techniques cannot be used, and an error in configuration memory can change the functionality of a block in the FPGA.

An Exemplary Twelve-Transistor SEU-Tolerant Memory Cell

A high-energy particle can generate charge along a two-micron to three-micron run path in silicon. If the run path is essentially parallel to the surface of an IC, these generated charges can upset (i.e. corrupt) several bits along the run path. As fabrication techniques have improved, the dimensions between transistors in a memory cell have decreased, thus increasing the chance that a single high-energy particle might upset more than one data bit. In particular, a single particle might upset both half cells of a SEU-tolerant memory cell if the critical portions of the half cells are less than about three microns apart.

FIG. 3A is a circuit diagram of an SEU-tolerant memory cell 300 according to an embodiment of the invention. The memory cell 300 is split into two half cells 302, 304. The half cells 302, 304 are essentially mirror images of each other, and are connected to each other with interconnect lines 301, 303, 305, 307, 309, 311, 313. The combination of the two half cells 302, 304 and interconnect lines 301, 303, 305, 307, 309, 311, 313 results in the twelve-transistor SEU-tolerant memory cell 300. The first half cell 302 is sufficiently separated from the second half cell 304 in a memory array (see FIGS. 4A, 4B) so that a single SEU event is unlikely to corrupt both half cells.

In the SEU-tolerant memory cell 300, the data is stored in node Q and QQ, while the opposite value is stored in $\overline{Q}$ ("Q-bar") and $\overline{QQ}$ ("QQ-bar"). Whenever one of these nodes changes in value due to an SEU, the next stage will change value as well, but the third inverter will tri-state (i.e. both the PMOS transistor 308 and the NMOS transistor 310 will be OFF) and the third inverter will maintain its data value long enough for the fourth inverter 312 to remain in the correct state, which allows the first stage (which in this example is the one affected by the SEU) to recover from the injected charge and return to its originally stored value.

Writing data into the memory cell 300 is achieved by writing the data simultaneously into multiple nodes. For example, when writing a "0" into node Q, a "0" is also written into node QQ, and when writing a "1" into Q, a "0" is transferred into Q-bar and QQ-bar. Therefore, this memory cell 300 has four passgates 314, 316, 318, 320 that are all connected to the same wordline or address A. The memory cell 300 will only lose its stored value if an SEU occurs in two nodes simultaneously (such as in node Q and node QQ or in Q-bar and QQ-bar). Therefore, it is desirable to separate the two half cells 302, 304 by at least 2 microns.

An Exemplary Memory Array Layout

Figure 4A:
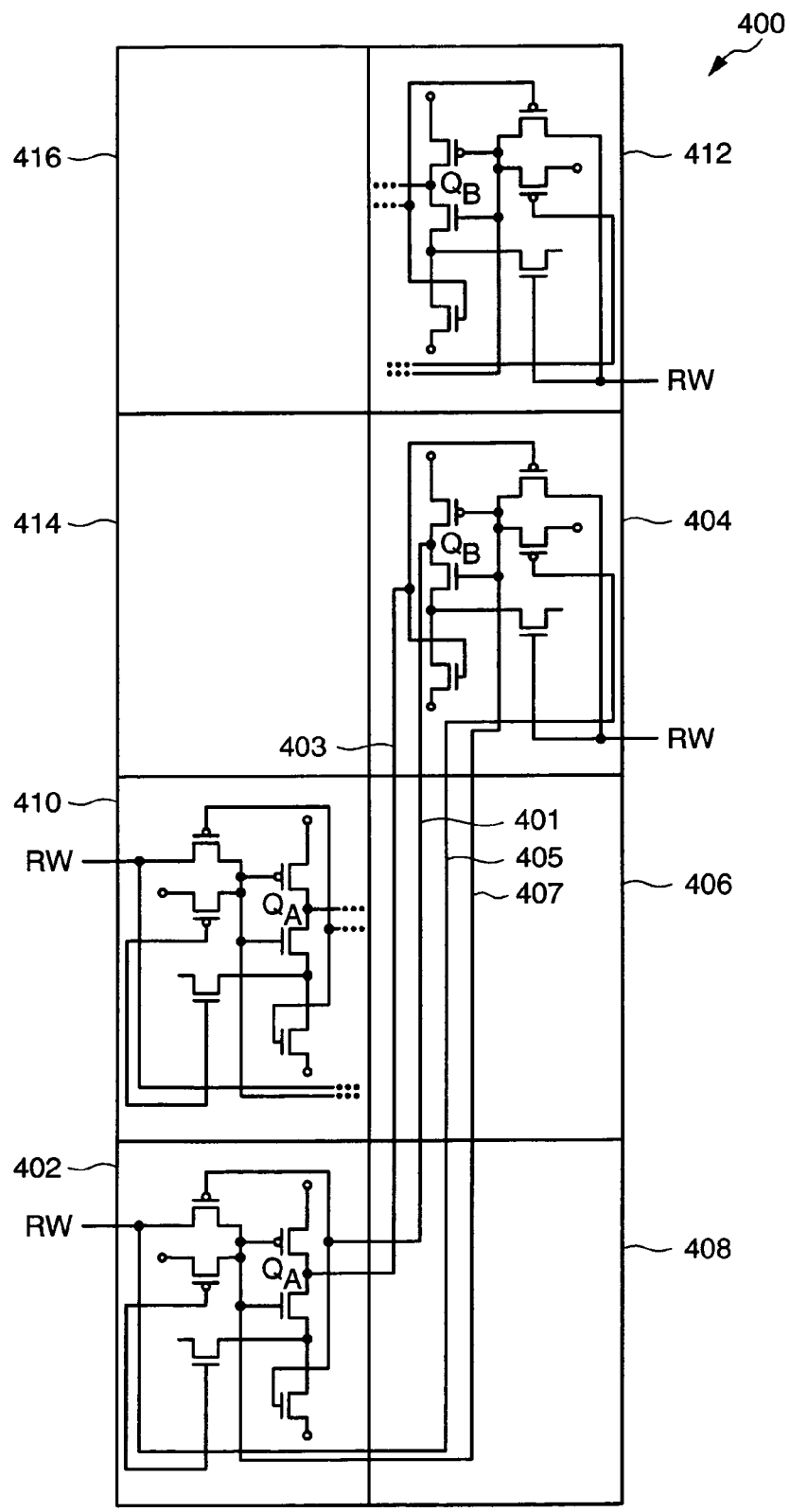
FIG. 4A is a diagram of a memory array according to an embodiment of the invention.

FIG. 4A is a diagram of a memory array 400 according to an embodiment of the invention. The memory array is a two-column by four-row memory array that is equivalent to a one-column by two-row (two cell) conventional SEU-tolerant memory array. In a conventional memory array, rows of SEU-tolerant memory cells are arranged in columns. In the memory array 400, a first six-transistor memory half cell 402 is electrically coupled (via interconnect lines 401, 403, 405, 407) to a second six-transistor half-cell 404 to form an SEU-tolerant memory cell (compare to FIG. 1A, ref. num. 100). The number of transistors in each half cell is merely exemplary. Similarly, other circuit topologies are used in alternative embodiments.

The first half cell 402 of an SEU-tolerant memory cell is in the first (bottom) row of the memory array 400. The second half cell 404 of the SEU-tolerant memory cell is in the third (from the bottom) row of the memory array 400. Hence, the half cells 402, 404 are separated by two rows of the memory array 400.

Note that the SEU-tolerant memory cell formed by the first and second half cells 402, 404 does not require significant additional area on the substrate. In other words, while the first half cell 402 is offset by two rows of the memory array 400 from the second half cell 404, the two half cells 402, 404 consume essentially the same space on the substrate as a conventional twelve-transistor memory cell (compare FIG. 1A). The interconnect lines 401, 403, 405, 407 are typically routed in a patterned metal layer above the silicon, and do not consume additional area on the wafer. A third six-transistor half cell 410 is offset by two rows and electrically coupled to a fourth six-transistor half-cell 412 to form a second SEU-tolerant memory cell in the memory array 400. The interconnect lines between the third half cell 410 and the fourth half cell 412 are omitted for clarity and simplicity of illustration)

"Offset half cells" 406, 408 fill out the memory array 400 below the second half cell 404, and offset half cells 414, 416 fill out the memory array 400 above the third half cell 410. In a particular embodiment, the offset half cells are essentially empty and separate portions (e.g. half cells) of an SEU-tolerant memory cell into different rows of the memory array. Although only four half cells (forming two SEU-tolerant memory cells) are shown in the memory array 400, additional rows of half cells may be added to the memory array using only the four offset half cells 406, 408. Thus, a large memory array of SEU-tolerant memory cells is achieved with only a few offset half cells. Furthermore, offsetting columns of memory half cells allows diagonally coupling each memory half cell to its corresponding memory half cell without crossing interconnect lines. This allows having the interconnect lines in a single metal layer of the device.

Figure 3:
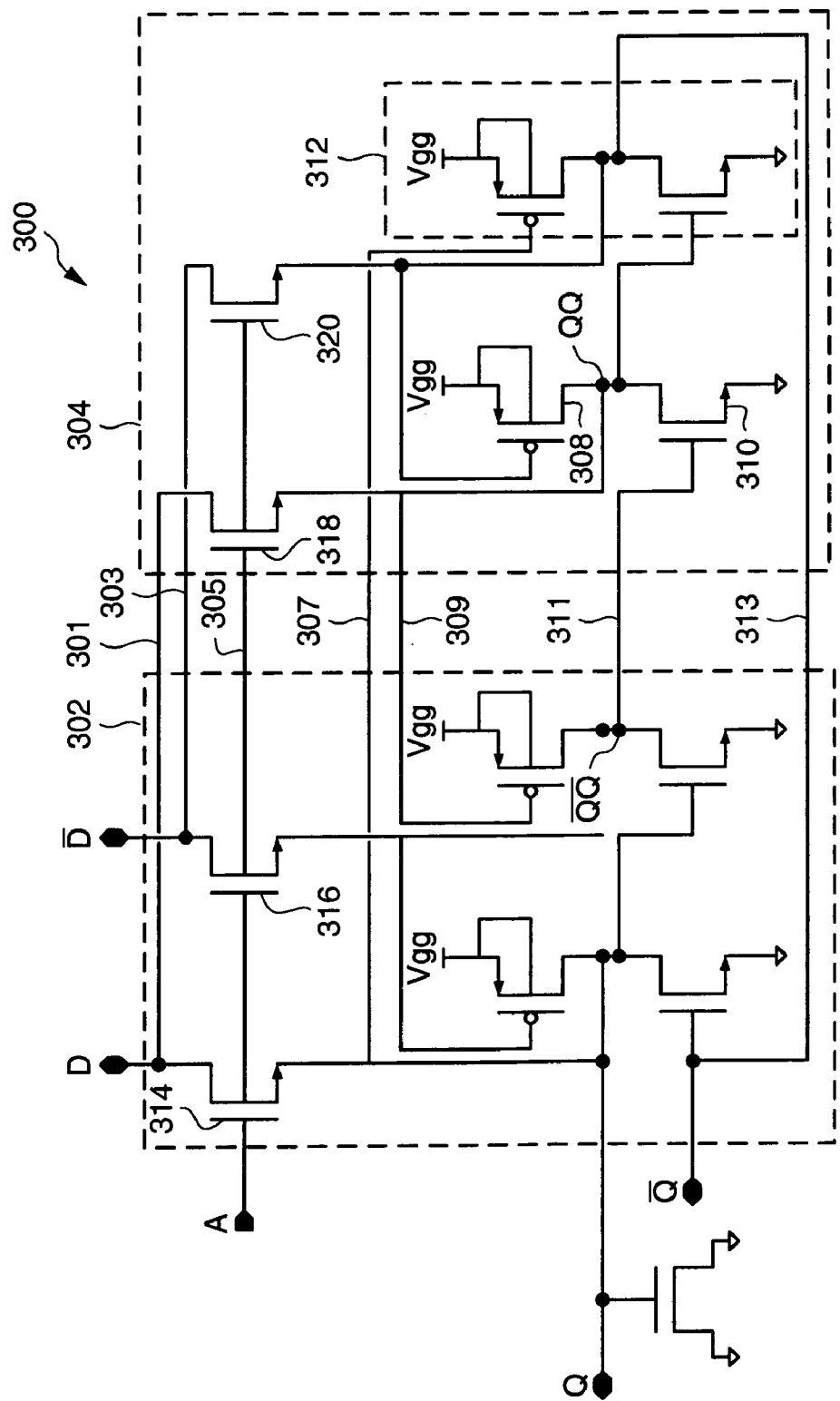
FIG. 3 is a circuit diagram of an SEU-tolerant memory cell according to an embodiment of the invention.

FIG. 4B is a diagram of a memory array 420 according to another embodiment of the invention. The memory array 420 is commonly referred to as a "2×10" memory array because a conventional 2×10 memory array has two columns, each column having ten rows. The memory array 420 has four columns 422, 424, 426, 428 each having twelve rows of ten memory half cells plus two offset rows of offset half cells. In a particular embodiment, each memory half cell is a six-transistor memory half cell, such as are shown in FIG. 3 and in FIG. 4A. Alternative embodiments use other types of half cells.

Each memory half cell in a column is electrically coupled to a memory half cell in an adjacent column that is offset by at least two rows. It is desirable to offset half cells of an SEU-tolerant memory cell by at least two rows to avoid simultaneous damage to both half cells in a memory cell from a high-energy particle traveling diagonally to the memory array. Otherwise, damage to both diagonally separated half cells of a memory cell may occur, corrupting the data stored in the memory cell. The top two rows include offset half cells S1, S2, S3, S4 and memory half cells M1B, M2B, M11A, M12A, and the bottom two rows include offset half cells S5, S6, S7, S8 and memory half cells M9A, M10A, M19B, M20B. In alternative embodiments, memory half cells of an SEU-tolerant memory cell are offset by more than two rows in a memory array.

For example, memory half cell M1A is offset from memory half cell M1B by two rows. Memory half cell M1A and memory half cell M1B, in addition to their interconnect lines (which are not shown) form an SEU-tolerant memory cell because each half cell is separated from the other. Similarly, memory half cell M2A is electrically coupled to memory half cell M2B to form a second SEU-tolerant memory cell, and so on down the column, where memory half cell M9A forms a ninth SEU-tolerant memory cell with memory half cell M9B and memory half cell M10A forms a tenth SEU-tolerant memory cell with memory half cell M10B. Thus, columns 422, 424 form a column with similar functionality to a conventional column in a 2×10 memory array.

Columns 426 and 428 combine to form another ten SEU-tolerant memory cells. For example, memory half cells M11A and M11B combine to form an eleventh SEU-tolerant memory cell, and memory half cells M12A and M12B combine to form a twelfth SEU-tolerant memory cell. Similarly, memory half cells M19A and M19B combine to form a nineteenth SEU-tolerant memory cell and memory half cells M20A and M20B combine to form a twentieth SEU-tolerant memory cell. Thus, the memory array 420 provides the functionality of a conventional 2×10 memory array, namely, twenty memory cells, merely by adding two rows of offset half cells. However, each of the memory cells is an SEU-tolerant memory cell that is extremely unlikely to be corrupted by a single high-energy particle event.

It is generally desirable that one half cell of a memory is offset from the other half cell by at least two microns. The memory array 420 is scalable to a larger size (e.g. a 2×20 memory array) without having to add additional rows of offset half cells. In other words, a larger two-column memory array is achievable using the same number of offset half cells. In an alternative embodiment, the first and third columns have offset half cells in the first two rows, and the second and fourth columns have offset half cells in the last two rows.

While the present invention has been described in connection with specific embodiments, variations of these embodiments will be obvious to those of ordinary skill in the art. For example, memory half cells with more than six transistors or less than six transistors are used in alternative embodiments. Similarly, offset half cells may have circuit functionality unrelated to a memory cell in a memory array (i.e. the offset half cells are not empty silicon). Therefore, the spirit and scope of the appended claims should not be limited to the foregoing description.

The invention claimed is:

1. A memory array comprising:
    a first column having a first plurality of rows, each of the first plurality of rows having a corresponding first plurality of memory half cells; and
    a second column having a second plurality of rows, each of the second plurality of rows having a corresponding second plurality of memory half cells, a first memory half cell in the first column being coupled to a second memory half cell in the second column to form a memory cell, the first memory half cell being offset from the second memory half cell by at least two rows.

2. The memory array of claim 1 wherein the memory cell is a single-event-upset-tolerant memory cell.

3. The memory array of claim 1 wherein the first memory half cell is a first six-transistor memory half cell.

4. The memory array of claim 3 wherein the second memory half cell is a second six-transistor memory half cell.

5. The memory array of claim 1 wherein the second memory half cell is essentially a mirror image of the first memory half cell.

6. The memory array of claim 1 wherein the first column includes at least two offset half cells at a first end and the second column includes at least two offset half cells at a second end, the second end being opposite the first end in the memory array.

7. The memory array of claim 1 wherein the first column is adjacent to the second column.

8. The memory array of claim 1 wherein the first memory half cell is coupled to the second memory half cell with interconnect lines.

9. The memory array of claim 8 wherein the interconnect lines are routed in a layer above the first and second pluralities of memory half cells.

10. The memory array of claim 1 wherein each of the first plurality of memory half cells is coupled to a corresponding each of the second plurality of memory half cells offset from each of the first plurality of memory half cells by at least two rows to form a plurality of memory cells.

11. The memory array of claim 10 wherein each of the plurality of memory cells is a single-event-upset-tolerant memory array.

12. A field-programmable gate array comprising a memory array according to claim 1.

13. A memory system comprising:
    means for a first column having a first plurality of rows of memory half cells;
    means for a second column having a second plurality of rows of memory half cells offset from the first plurality of memory half cells by at least two rows; and
    means for coupling each of the first plurality of memory half cells to a corresponding each of the second plurality of memory half cells to form a plurality of memory cells, each of the plurality of memory cells including a first memory half cell offset from a second memory half cell by at least two rows.

* * * * *